United States Patent [19]
Campardo et al.

[11] Patent Number: 5,748,528
[45] Date of Patent: May 5, 1998

[54] EEPROM MEMORY DEVICE WITH SIMULTANEOUS READ AND WRITE SECTOR CAPABILITIES

[75] Inventors: Giovanni Campardo, Bergamo; Lorenzo Bedarida, Vimercate; Giuseppe Fusillo; Andrea Silvagni, both of Milan, all of Italy

[73] Assignee: SGS-Thomson Microelectronics S.r.l., Agrate Brianza, Italy

[21] Appl. No.: 642,813

[22] Filed: May 3, 1996

[30] Foreign Application Priority Data

May 5, 1995 [EP] European Pat. Off. .............. 95830183

[51] Int. Cl.$^6$ .................................................. G11C 16/06
[52] U.S. Cl. ................... 365/185.13; 365/185.11; 365/230.06
[58] Field of Search ................ 365/185.11, 185.13, 365/230.03, 230.06

[56] References Cited

U.S. PATENT DOCUMENTS

| | | | |
|---|---|---|---|
| 4,130,890 | 12/1978 | Adam | 365/184 |
| 5,065,364 | 11/1991 | Atwood | 365/185 |
| 5,117,269 | 5/1992 | Bellezza et al. | 357/23.5 |
| 5,132,928 | 7/1992 | Hayashikoshi | 365/63 |
| 5,245,570 | 9/1993 | Fazio et al. | 365/185 |
| 5,245,572 | 9/1993 | Kosonocky et al. | 365/189.02 |
| 5,355,334 | 10/1994 | Koga | 365/189.01 |
| 5,361,343 | 11/1994 | Kosonocky | 365/230.03 |
| 5,392,252 | 2/1995 | Rimpo et al. | 365/230.02 |
| 5,581,509 | 12/1996 | Golla | 365/200 |

FOREIGN PATENT DOCUMENTS

| | | | |
|---|---|---|---|
| 369 829 | 5/1990 | European Pat. Off. | G06F 15/403 |
| 422 347 | 4/1991 | European Pat. Off. | G11C 8/00 |
| 509 696 | 10/1992 | European Pat. Off. | H01L 27/115 |
| 522 780 | 1/1993 | European Pat. Off. | G06F 3/06 |
| 540 363 | 5/1993 | European Pat. Off. | G06F 13/16 |
| 552 531 | 7/1993 | European Pat. Off. | H01L 27/115 |
| 618 586 | 10/1994 | European Pat. Off. | G11C 7/00 |
| 4049595 | 2/1992 | Japan | G11C 11/41 |
| 94/14196 | 6/1994 | WIPO | H01L 27/115 |
| 94/17528 | 8/1994 | WIPO | G11C 8/00 |

OTHER PUBLICATIONS

Eitan, Boaz et al., "Alternate Metal Virtual Ground (AMG)—A New Scaling Concept for Very High–Density EPROM's" in IEEE Electron Device Letters, Aug. 1991, vol. 12, No. 8.

Kammerer, W. et al., A new Virtual Ground Array Architecture For Very High Speed; High Density EPROMS, 1991 Symposium on VLSI Circuits, May 30–Jun. 1, 1991, Oiso, Japan.

*Primary Examiner*—David C. Nelms
*Assistant Examiner*—Son Mai
*Attorney, Agent, or Firm*—David V. Carlson; Seed and Berry LLP

[57] ABSTRACT

A memory device having a memory array, a row decoding unit, a column decoding unit, and a control unit; the memory array presents global bit lines extending along the whole of the array and connected to respective local bit lines, one for each of the sectors; a switch is provided between the global bit lines and each respective local bit line to selectively connect a selected global bit line and only one of the associated local bit lines; and the switches are controlled by local decoding units over control lines, to address the sectors independently and so perform operations (read, erase, write) simultaneously in two different sectors in different rows and columns.

27 Claims, 6 Drawing Sheets

EEPROM MEMORY DEVICE WITH SIMULTANEOUS READ AND WRITE SECTOR CAPABILITIES

TECHNICAL FIELD

The present invention relates to a nonvolatile flash-EEPROM memory device capable of performing different operations in different sectors.

BACKGROUND OF THE INVENTION

At present, nonvolatile, and in particular flash-EEPROM, memories fail to provide for simultaneously reading one sector and writing or erasing another, which means the memory is blocked and cannot be used for performing other (e.g., read) operations in other sectors until the write or erase operation is terminated. In view of the long time required for erasure, such a limitation is disadvantageous, especially if the memory forms part of a microcontroller, in which case, the microcontroller must comprise appropriate circuits for blocking access to the flash memory, thus increasing the complexity of the system.

For a better idea of the problem underlying the present invention, FIG. 1 shows the architecture of a flash memory with sectors organized in columns.

Memory 1 in FIG. 1, which only shows the parts pertinent to the present invention, comprises a memory array 2 composed of memory cells organized in rows and columns and addressed by word lines and bit lines shown schematically by arrows 8 and 9; a row decoder 3 from which extend the word lines for biasing the selected row of array 2; a column decoder 4 to which bit lines 9 are connected, and which provides for biasing and connecting the addressed bit line (or lines) of array 2 to the output; a sense amplifying unit 5 in turn comprising a number of sense amplifiers and connected to column decoder 4 to sense the information coded in the memory cells selected by means of decoders 3 and 4; an output unit 6 connected to sense amplifying unit 5, for temporarily retaining the data sensed by unit 5; and a control unit 7 defining, for example, a finite state machine FSM for generating the addresses for row and column decoders 3 and 4, and the control signals for units 5 and 6. For the sake of simplicity, control unit 7 is also assumed to comprise a supply generating section for generating the necessary supply voltages, and to generate the coded addresses supplied from outside memory 1 (arrow 7a) or inside unit 7 according to the operation to be performed (e.g., sequential check of the content of the memory cells during erase).

The cells of array 2 are grouped into sectors; and the cells in the same sector present a common terminal, e.g., the source terminal, so that they are all erased together. In the example shown, the memory cells are grouped into three sectors 2a, 2b, 2c organized in columns, but the following description also applies equally to sectors organized in rows.

To erase a sector, a series of operations is commenced to perform a preconditioning step, and an erase step comprising the actual erase procedure and a verify procedure.

The preconditioning step provides for bringing all the cells in the sector to the same condition prior to actual erasure, and so ensuring they are all erased similarly. For this purpose, the bytes composing the digital words memorized in the cells are addressed successively, and the cells relative to the bytes are written and then verified using row and column decoders 3, 4 and sense amplifying unit 5. The actual erase and verify procedures also require the use of row and column decoders 3, 4 and unit 5, so that erasure of a sector takes some time (in the order of 1 sec) during which the decoders and amplifying unit 3–5 are engaged in biasing and verifying, and cannot be used for other functions—a situation which is of course undesirable.

SUMMARY OF THE INVENTION

It is an object of the present invention to provide a nonvolatile memory device capable of performing different operations in different sectors, e.g., erase one sector while simultaneously reading another.

According to principles of the present invention, a memory array is divided into a plurality of sectors. The sectors are arranged in rows and in columns. Each sector contains a plurality of memory cells. Each sector, and thus each memory cell in the sector, is independently accessible through sector column select lines and through sector row select lines. Thus, one row of memory sectors may be selected and one column of memory sectors may be selected for performing a desired operation, such as a read or write. Simultaneously, a separate, unrelated sector in a different row of sectors may also be selected and a separate column of sectors may be selected, and unrelated operations carried out in these separate rows and columns of different sectors. For example, one column of sectors may be accessed for erasure while simultaneously another column of sectors is accessed for reading.

Local column decoders are provided to permit individually accessing each column of sectors independent of each other. Similarly, individual row decoders are provided for each row of sectors so that any row of memory sectors may be accessed and addressed independent of every other row of sectors.

Incorporated by reference are the following European patent application numbers:

95830182.2 filed May 5, 1995;
95830184.8 filed May 5, 1995 and
95830133.0 filed May 5, 1995.

BRIEF DESCRIPTION OF THE DRAWINGS

A number of preferred, non-limiting embodiments of the present invention will be described by way of example with reference to the accompanying drawings, in which.

DETAILED DESCRIPTION OF THE INVENTION

Figure 1:
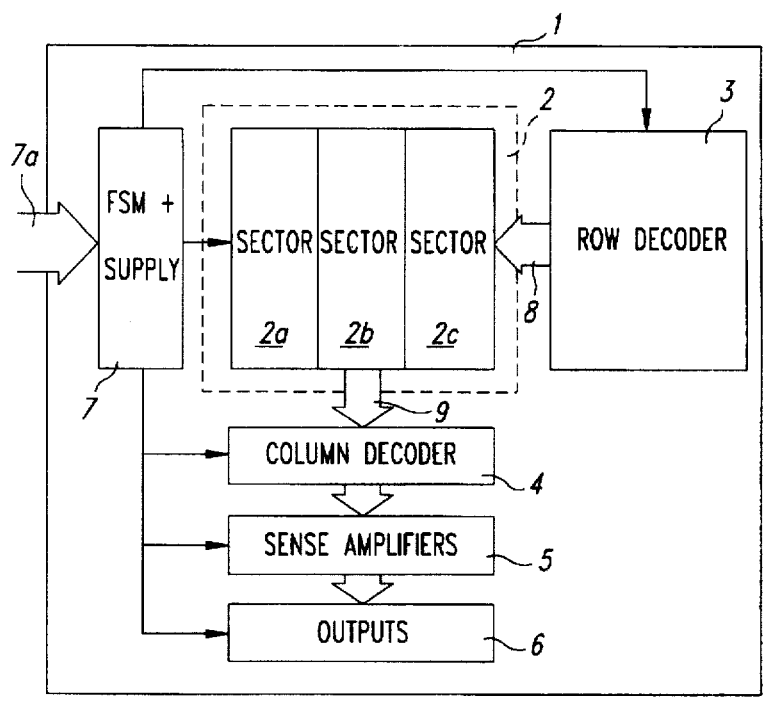
FIG. 1 shows the architecture typical of a known memory and also valid for certain embodiments of the present invention.
Figure 2:
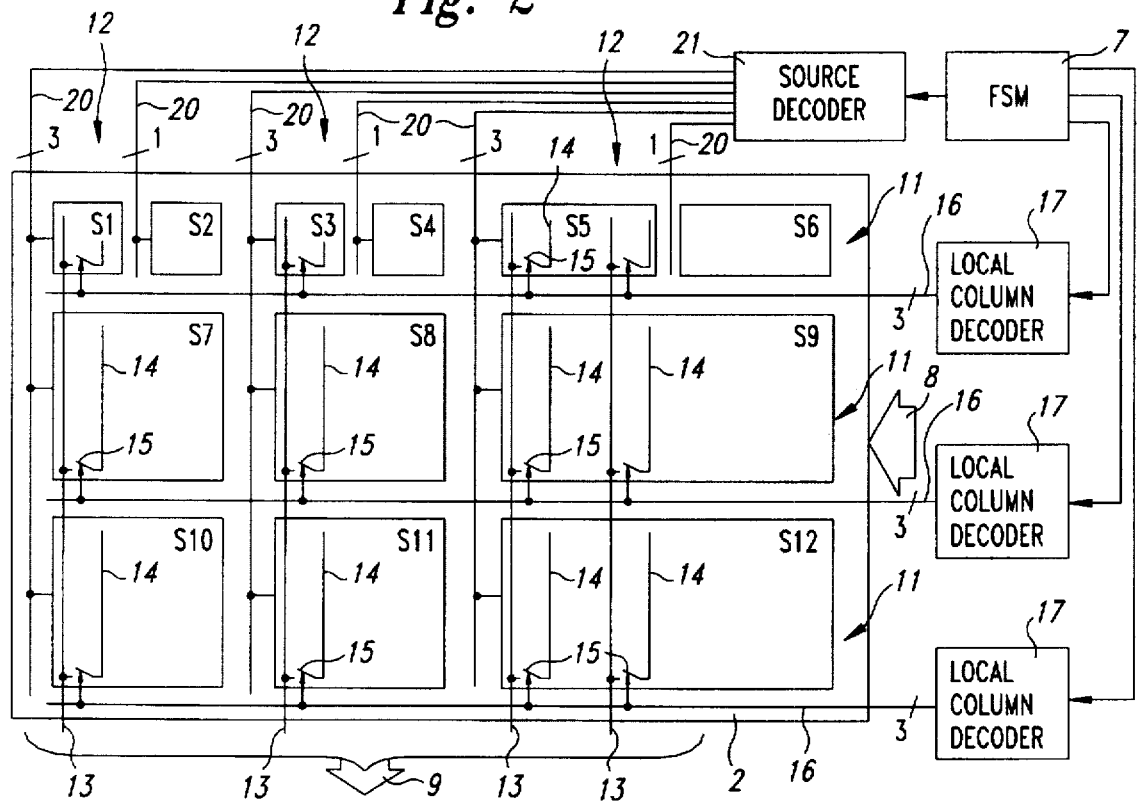
FIG. 2 shows, schematically, the structure of the memory array according to a first embodiment of the present invention.

According to a first aspect of the invention, the memory device presents the overall architecture in FIG. 1, and the memory array is so formed as to permit a number of operations to be performed simultaneously in different sectors. FIG. 2 shows an example embodiment of the memory array, wherein the array 2 comprises twelve sectors S1–S12 of different sizes; sectors S1–S6 being smaller and used for data storage; and sectors S7–S12 being larger and used for program storage.

Sectors S1–S12 are arranged in rows 11 and columns 12 defining two perpendicular alignment directions. More specifically, sectors S1–S6 are arranged in a first row, sectors S7–S9 in a second row, and sectors S10–S12 in a third row; and, in view of the difference in size, each column comprises two of the smaller sectors, i.e., the first column comprises sectors S1, S2, S7, S10, and so on. For the purpose of the present invention, therefore, i.e., as regards simultaneous addressing of two sectors for read and erase or, at any rate, for performing different operations, each pair of smaller sectors S1–S6 in the same column, namely S1, S2; S3, S4; and S5, S6 will hereinafter be considered a single sector each. At the expense of a slight increase in complexity and size, however, sectors S1–S6 may also be managed independently.

Global bias lines 13 extend along the whole of matrix 2 in one of the two alignment directions and are connected to local bias lines 14. For one embodiment as shown in FIG. 2 the global bias lines 13 are global bit lines and these extend along the full length of sector columns 12. There is one local bias line 14 for each sector in said alignment direction, and in this case, one for each of the three sectors in the sector column 12 along which the global bit line 13 extends. Between global bias lines 13 and each respective local bias line 14, a switch 15 is provided for selectively connecting a selected global bit line 13 and only one of the three associated local bit lines 14, and thus biasing the sectors independently to perform operations (read, erase, write) simultaneously in two different sectors forming part of different lines (rows and columns).

All switches 15 that are in the same sector are controlled in common but independently of the switches 15 in the other sectors. However, in this example one exception is that for sector pairs S1–S2, S3–S4, S5–S6, the switches in the sectors in each pair of which are controlled by the same control signal as indicated above. For this purpose, the control terminals of switches 15 are connected to control lines 16—one for each sector connected to this control line bus 16—connected to one or more local decoders 17. In the FIG. 2 example, the three control lines 16 for controlling the switches for sectors in the same row are connected to a respective local column decoder 17.

FIG. 2 also shows, schematically, source lines 20—one for each sector—connected to a source decoder 21 in turn controlled by control unit 7 to bias lines 20 according to the read, write and erase steps of each sector. Each source bus 20 is connected appropriately to circuits in the respective sectors, one line per sector and one bus for each column of sectors. The control unit 7 controls the source decoder 21 to generate the appropriate voltage levels on each source line 20a, 20b, 20c within each source bus 20.

To permit operations to be performed simultaneously in sectors S1–S12, appropriate changes must obviously also be made to circuits 3–5. One acceptable structure is to simply duplicate each of these circuits 3, 4 and 5 for each sector row and each sector column, respectively.

Figure 3:
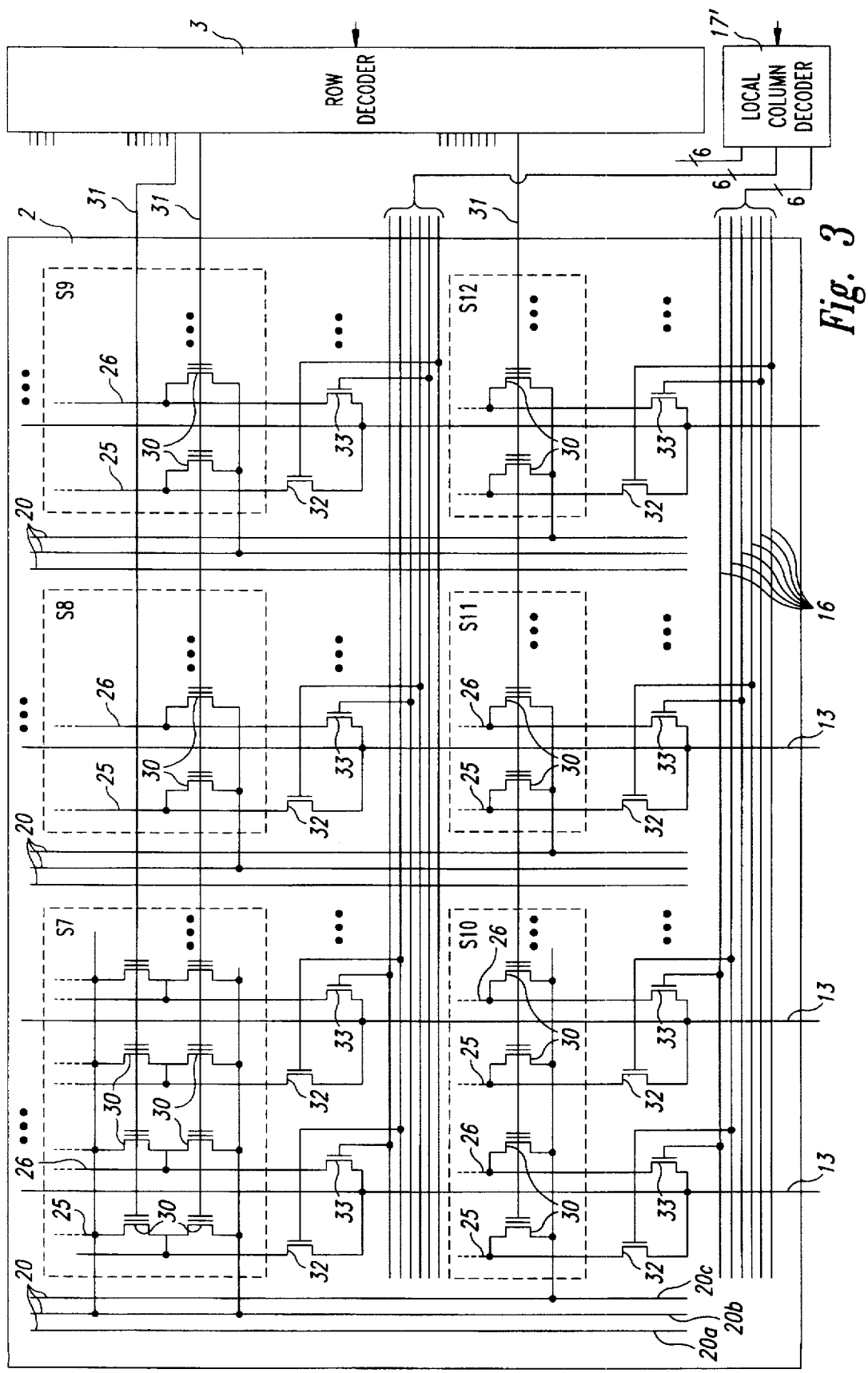
FIG. 3 shows a more detailed view of a variation of the FIG. 2 memory array.

A further embodiment of the FIG. 2 memory array is shown in FIG. 3, which shows a number of the memory cells and the switches of sectors S7–S12 only. The structure shown for sectors S7–S12, however, is also the same for sectors S1–S6.

In the FIG. 3 example, each global bit line in each sector is connected to two local bit lines 25 and 26 for better compacting the cells, bearing in mind that the global bit line 13—typically formed in the second metal level—must be wider than the local bit lines 14—typically formed in the first metal level—to ensure a sufficient size of the contacts. As such, six control lines 16 are provided for each sector row 11. In FIG. 3, provision is also made for only one local column decoder 17' which combines the functions of the three decoders 17 in FIG. 2.

Each sector S7–S12 (and also each sector S1–S6 not shown) comprises a number of memory cells 30 arranged in rows and columns. In known manner, all the cells 30 in each sector present the source terminal connected to the same common source line 20, and the cells 30 in the same row of cells present the control gate terminal connected to the same word line 31 (in common with all the cells in the same row of cells in the adjacent sectors). The cells 30 in the same column of cells present the drain terminal connected to one of the two local bit lines, and more specifically in such a manner that, in the direction of word lines 31, the cells connected to a local bit line 25 alternate with those connected to a local bit line 26.

Each pair of local bit lines 25, 26 is connected to the respective global bit line 13 by a selection transistor 32, 33 with its gate terminal connected to a control line 16. More specifically, the transistors 32 in each sector (interposed between the global bit lines 13 of the sector and a respective local bit line 25) are all connected to the same control line 16; and the transistors 33 in each sector (between global bit lines 13 and respective local bit lines 26) are all connected to a different control line 16 (as shown in more detail for sectors S7 and S10). As such, in the example shown, in which each sector row 11 comprises three sectors (or compound sectors, in the case of sectors S1–S6), six control lines 16 are sufficient for each sector row 11.

Control lines 16 preferably extend in the gap normally existing between two different sector rows 11, preferably in the form of first-level metal lines. In the example shown, common source lines 20 extend in the gap normally existing between two different sector columns 12, but in the alternative, in the event the global bias lines are the word lines, the gap between the columns may be occupied by control lines for the selection transistors of associated local word lines, which is the solution adopted, for example, when gate stress cannot be disregarded.

Figure 4:
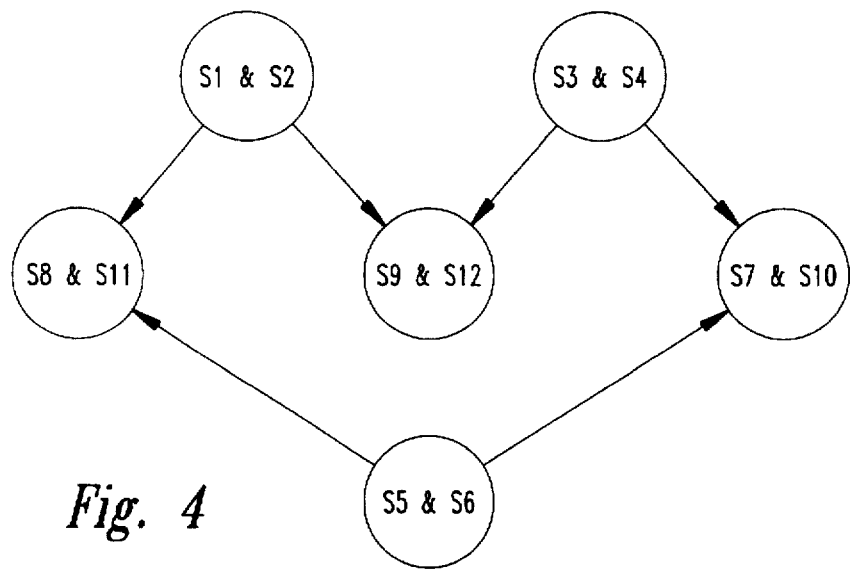
FIG. 4 shows a logic diagram illustrating the various ways of addressing the FIG. 2 and 3 memory.

With the memory array structure shown in FIGS. 2 and 3, it is possible to read data from a sector in a given row 11 and column 12, and erase data from a different sector in a different row and column. The possibilities afforded by the local decoding system shown are illustrated schematically in FIG. 4 relative to a sector configuration as shown in FIGS. 2 and 3. More specifically, and as shown in FIG. 4, performance of an operation (read, write, erase) in sector S1 or S2 (i.e., access to sector S1 or S2) permits simultaneous performance of an operation in (i.e., access to) one of sectors S8, S11, S9, S12; access to sector S3 or S4 permits simultaneous access to one of sectors S9, S12, S7, S10; and access to sector S5 or S6 permits simultaneous access to one of sectors S8, S11, S7, S10.

Figure 5:
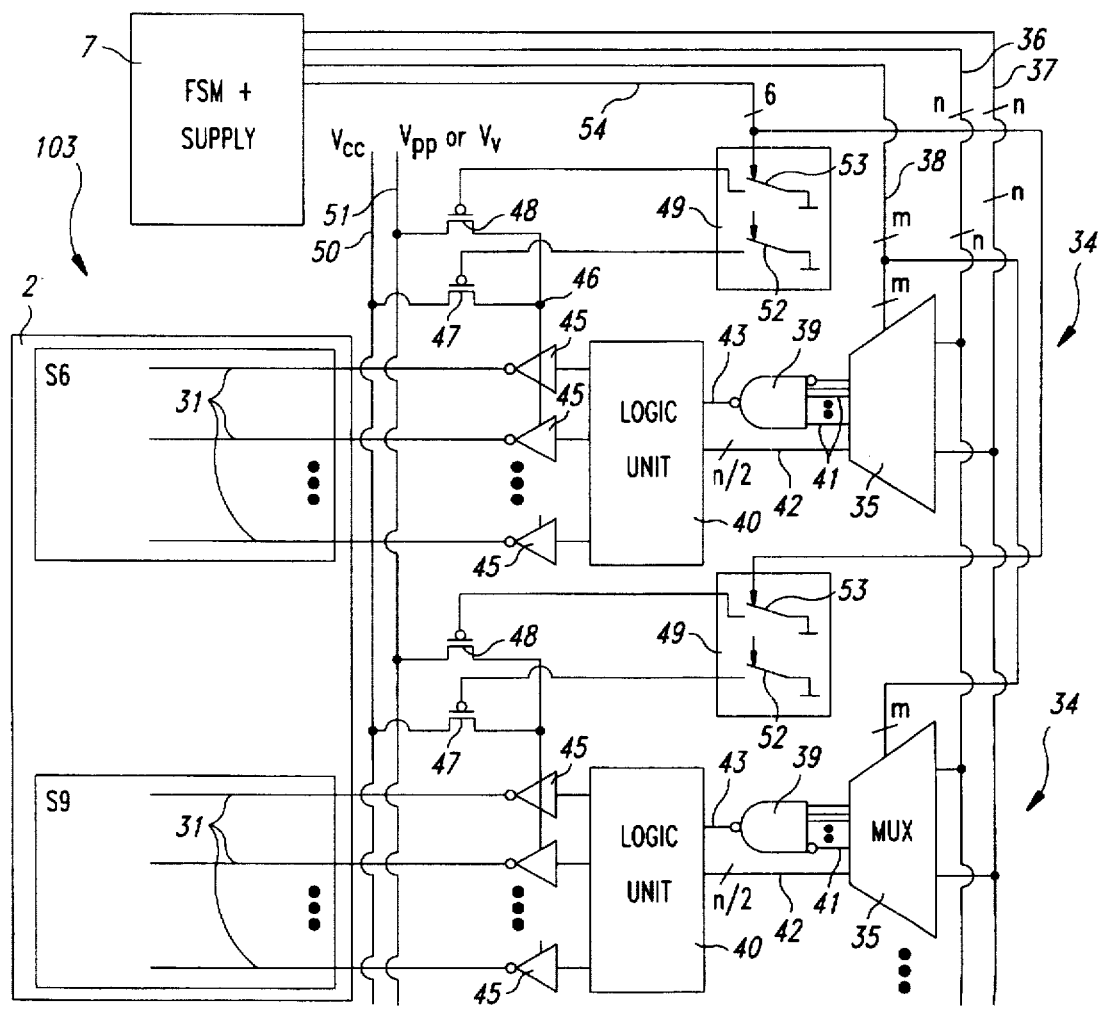
FIG. 5 shows a simplified circuit diagram of one implementation of the row decoder of the memory according to the present invention.
Figure 7:
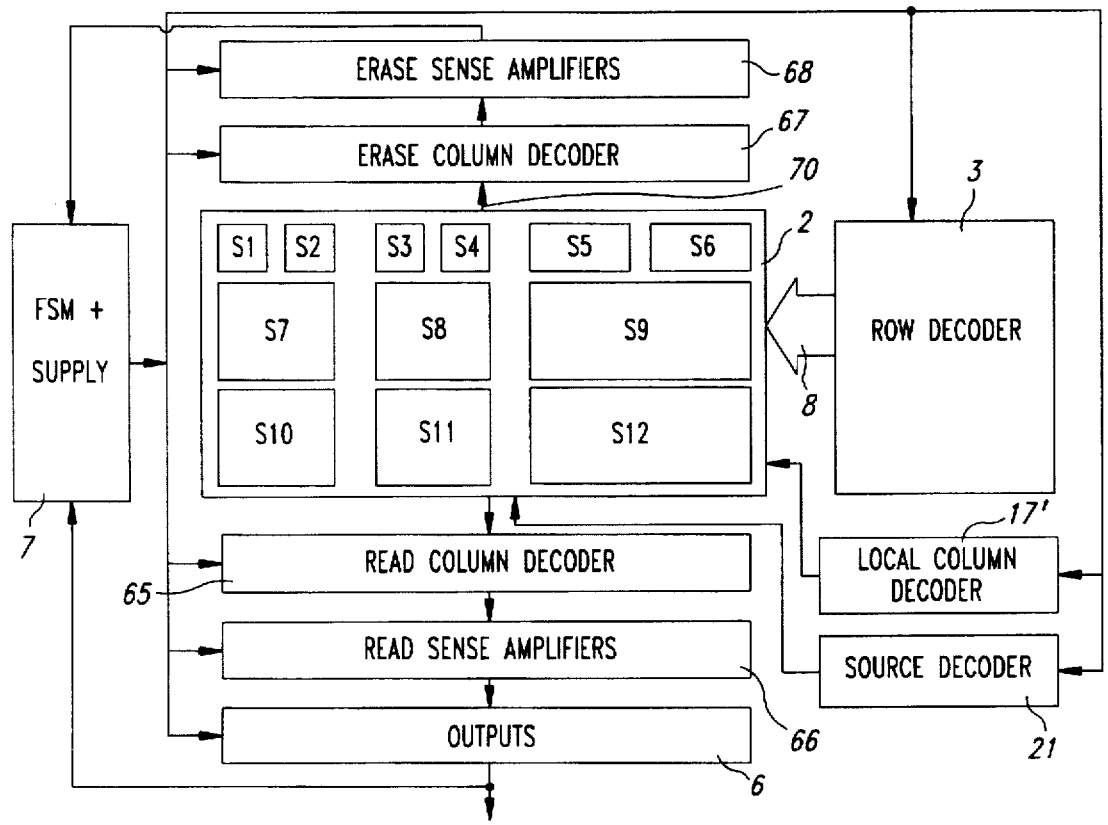
FIG. 7 shows a further architecture of the memory according to the present invention.

For example, to erase data sector S3 without interrupting performance of the program memorized in program sectors S9 and S12, which must therefore remain accessible when erasing sector S3, it is possible to maintain common source line 20 connected to sector S3 at 12 V, and all the rows of sector S3 at 0 V, while finite state machine 7 (FIG. 1) controls the erase duration. At the same time, finite state machine 7 provides for addressing the rows and columns of sectors S9 and S12 to read the program (or perform other operations). As is well known in prior art EEPROM circuits, Finite State Machines 7 (FSM), as shown in the prior art of FIG. 1, are used for controlling row and column decoders, sense amplifiers, and output circuits as well as providing the proper supply voltages at the correct time. The FSM 7 known in the art and available to those of skill in the art can be used to control these various circuits within the combination of this invention. Similarly, one of skill in the art, using currently available circuits could make a FSM 7 to output the proper control signals for the invention, as shown in FIGS. 2, 5, and 7.

The FSM 7 of FIG. 2 also has outputs to corresponding circuits 3, 4, 5 and 6, according to the invention, but these are not shown in FIG. 2 for the ease of illustration.

Figure 6:
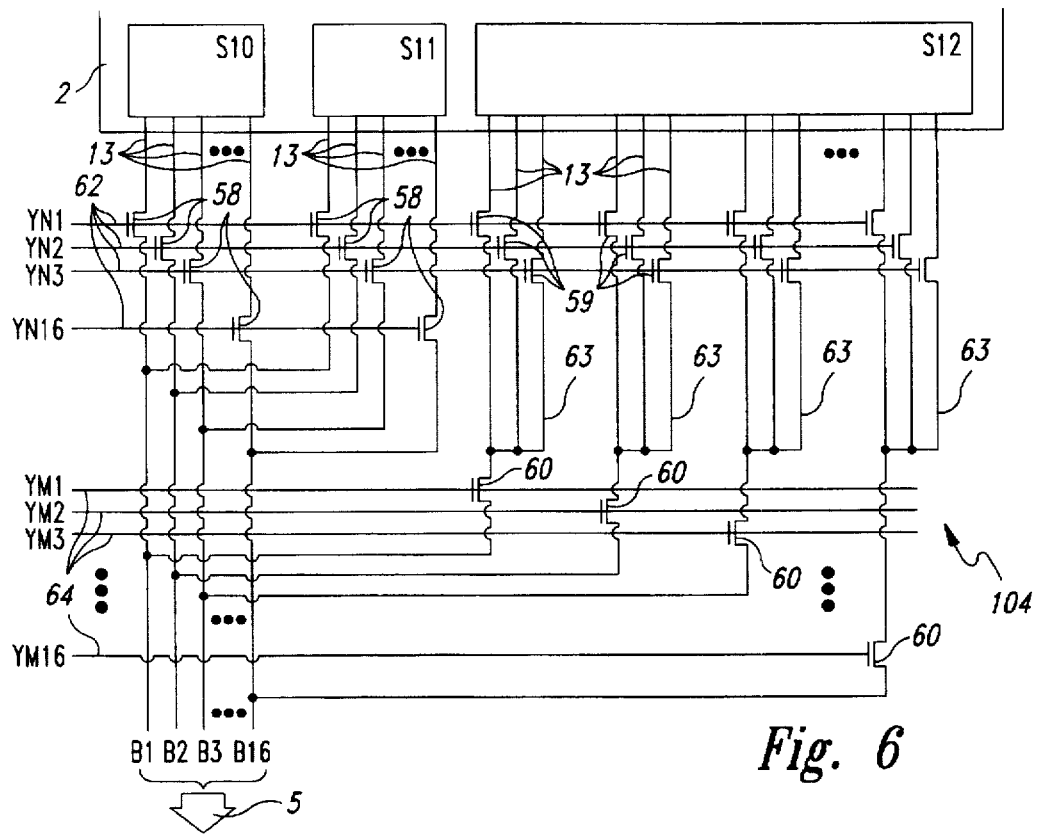
FIG. 6 shows a simplified circuit diagram of one implementation of the column decoder of the memory according to the present invention.

In one embodiment, separate column decoders, which sense amplifiers and outputs, are provided for each column of vectors. Alternatively, specially designed row and column decoders and sense amplifiers are used, as shown in FIGS. 5, 6 and 7.

As previously stated, in one embodiment, there is provided a separate row decoder 3 for each row of sectors so that the row decoder and column circuits are basically duplicated for each sector row and column. Alternatively, a specially designed row decoder or column can be provided as will now be explained with respect to FIGS. 5 and 6. According to a further aspect of the present invention, a novel row decoder is proposed, which is capable of addressing two different rows at the same time without fully duplicating the relative circuits for each row, and as shown in FIG. 5 described below.

The novel row decoder 103 in FIG. 5 comprises a number of decoding sections 34 equal to the number of sector rows 11 (in this case, three, of which only two are shown); and each decoding section 34 comprises a multiplexer 35 presenting 2n data inputs, where n equals the number of bits required to address all the rows in the memory array. The data inputs of multiplexers 35 are connected to two groups of n address lines 36, 37, each coding a different address; and multiplexers 35 also comprise m selection inputs connected to m selection lines 38 for specifying which multiplexers 35 are to use which of the two addresses on lines 36 and 37, to simultaneously address two different rows in array 2. In other words, by means of selection lines 38, each multiplexer knows whether it is to output the address on line 36, the address on line 37, or no address at all.

Multiplexers 35 therefore present a first number of outputs 41 (equal to n/2), and a second number of outputs 42 (equal to n/2). Outputs 41 are connected directly or inversely to the inputs of a NAND gate 39, and code a first half of the address specified on lines 36 or 37; and outputs 42 are connected to a logic unit 40, and code a second half of the address specified on lines 36 or 37. Logic unit 40 is also connected to the output 43 of NAND gate 39. In one embodiment, logic unit 40 is a standard combining circuit, in addition to a level shift circuit with a number of outputs equal to the rows in the relative sector column 12; and forms a two-level decoding circuit together with NAND gate 39. In practice, NAND gate 39, with its direct or inverted inputs, decodes the first half-address, and logic unit 40 decodes the second half-address, also using the output of NAND gate 39. In the alternative, any appropriate two level decoding circuit may be used for providing the word line signal on line 31.

Each output of each logic unit 40 is connected to a first input of a respective inverter 45, which has a second input connected to a node 46, and an output connected to a word line 31. Row decoder 3 comprises three nodes 46—one for each sector row 11; each node 46 is connected to two supply lines 50, 51 by respective P-channel MOS supply selection transistors 47, 48; and transistors 47, 48 have a control terminal connected to an enabling unit 49 (one for each sector row 11).

Line 50 supplies the voltage $V_{CC}$ for reading the cells, while line 51 supplies the erase voltage $V_{PP}$ or verify voltage $V_V$ for erasing and/or writing the cells.

Each enabling unit 49 substantially comprises a pair of switches 52, 53—one for each respective supply selection transistor 47, 48—for connecting or disconnecting the control gate of respective transistors 47, 48 to ground, and so turning the transistors on or off. Switches 52, 53 are controlled by control signals supplied by control unit 7 over enabling lines 54 (in this case, six in number, equal to the number of transistors 47, 48 and switches 52, 53) for controlling the state of switches 52, 53 and hence transistors 48, 49 supplying inverters 45. The selected voltage from line 50 or 51 becomes the supply voltage which is provided to the inverters 45. For a standard CMOS inverter, the node 46 is connected to the source of the P-channel transistor. Inverter 45, when enabled by its logic unit 40 on the basis of the address specified on lines 36 or 37, therefore biases respective word line 31 at the voltage on line 50 or 51, as specified by the control signals on lines 54; and, by virtue of duplicating address lines 36, 37, and by virtue of lines 38 controlling multiplexers 35 as described above, it is possible to send two different addresses over lines 36 and 37, and to address two different lines 31 in different sector rows 11 to perform two instructions simultaneously.

As is known, memory array outputs are currently organized so that the bits in the same word are distributed along one row (belonging to different sectors). Conversely, according to one alternative embodiment of the present invention, the outputs of memory array 2 are concentrated in the same sector. One embodiment of a column decoder implementing this type of organization is shown in FIG. 6 wherein, on account of the different number of cells per row in sector S12 with respect to sectors S10 and S11, and hence the different number of global bit lines extending from these sectors, the bit lines extending from sector S12 (and similarly from sectors S9, S5, S6) are decoded at two levels.

In FIG. 6, each sector is assumed to present sixteen outputs corresponding to sixteen bits to be sent to sense amplifiers 5; sectors S10 and S11 (and the corresponding sectors in the same sector column 12) are assumed to be connected to sixteen global bit lines; and sector S12 is assumed to be connected to forty-eight global bit lines. The architecture described below, however, may also be applied to different configurations with a different number of outputs (e.g., eight) and/or a different number of bit lines extending from the sectors.

The decoder 104 in FIG. 6 therefore comprises sixteen output lines B1, B2, ..., B16 (corresponding to the sixteen bits in each word) connected at one end to sense amplifiers 5, and at the other end to the global bit lines 13 of the array sectors via selection transistors 58–60. More specifically, the sixteen global bit lines 13 from sectors S10 and S11 are each connected to a respective output line B1–B16 by a respective first selection transistor 58, so that the first global bit line 13 of sector S10 is connected to the first global bit line 13 of sector S11 and to the first output line B1, the second global bit line 13 of sector S10 is connected to the second global bit line 13 of sector S11 and to the second output line B2, and so on. The selection transistors 58 on the global bit lines of sectors S10, S11 connected to the same output line B1–B16 are controlled by the same control signal YN1–YN16 supplied over a respective control line 62 connected to control unit 7.

Triplets 63 of global bit lines 13 of sector S12 are also connected to output lines B1–B16 by second selection transistors 60 controlled by respective signals YM1–YM16 supplied over control lines 64 also connected to control unit 7; and the three global bit lines 13 of sector S12 in the same triplet 63 (connected to the same output line B1–B16) are controlled by a respective third selection transistor 59. More specifically, the selection transistors 59 connected to the first global bit line in each triplet 63 are controlled by signal YN1 controlling the first global bit lines of sectors S10, S11; the selection transistors 59 connected to the second global bit line in each triplet 63 are controlled by signal YN2; and the selection transistors 59 connected to the third global bit line are controlled by signal YN3.

Consequently, to read the cells or some of the cells in a row in sector S10, row decoder 3 selects the row; local decoder 17 selects the columns (local bit lines 14 in FIG. 2, lines 25 or 26 in FIG. 3) in sector S10; and selection transistors 58 provide for selectively connecting the selected columns to the selected output line/s B1–B16 by means of signals YN1–YN16. Not being selected by local decoder 17, the other sectors S1–S9, S11 and S12 in no way interfere with the reading. Conversely, to read the cells or some of the cells in sector S12, selection transistors 60 only connect to output lines B1–B16 the triplet/s 63 of lines 13 specified by signals YM1–YM16; and, within each triplet 63, transistors 59 connect the global bit line 13 to be connected to the output. In this case also, sectors S1–S11 in no way interfere with the reading by not being selected by local column decoder 17.

Column decoder 104, however, only provides for successively reading two sectors, and must therefore be duplicated to permit two sectors in two different sector columns 12 to be read simultaneously. According to a further aspect of the present invention, therefore, a further column decoder and a further sense amplifier unit are provided. Since the architecture according to the invention is typically designed to permit reading of one sector and erasure or writing of another sector in a different sector column 12, the memory may be so controlled that one sense amplifier is only active during the erase verify procedure, and the other sense amplifier is only active during the read procedure. In which case, the sense amplifiers may be specialized according to the function to be performed, so as to eliminate, within each sense amplifier, the circuits relative to the discarded function, and employ the additional space for forming the additional decoding and sense units.

An alternative embodiment of the architecture is shown in FIG. 7, which shows a read column decoder 65; a read sense amplifier unit 66; an erase column decoder 67; an erase sense amplifier unit 68; units 6 and 7 of the FIG. 1 architecture; local column decoder 17' as in FIG. 2; and source decoder 21. Read units 65 and 66 are arranged in the same way as corresponding units 3, 4 in the FIG. 1 architecture; and erase units 67 and 68 are located on the opposite side of memory array 2, 2' in relation to units 65, 66. More specifically, erase column decoder 67 is connected to the top end of global bit lines 13 (arrow 70), and is controlled by control unit 7 in the same way as unit 4; and erase amplifier unit 68 is connected downstream from unit 67, and receives control signals from, and supplies output signals to, control unit 7.

Read and erase column decoders 65, 67 preferably present the same structure as unit 4, while sense amplifier units 66, 68 are specialized, as described above, so that each only includes the circuits relative to a respective function (read and verify).

To read, for example, sector S12 and verify sector S1 during erasure, the cell or cells in sector S12 to be read are appropriately biased by read column decoder 65, local column decoder 17', and row decoder 3; and, similarly, the cells in sector S1 to be verified are appropriately biased by erase column decoder 67, local column decoder 17', and row decoder 3 which therefore simultaneously addresses two different rows in the array—preferably as described with reference to FIG. 5—on the basis of two different addresses supplied over lines 36 and 37. Decoding (and reading) during writing are preferably performed by erase units 67 and 68.

Figure 8:
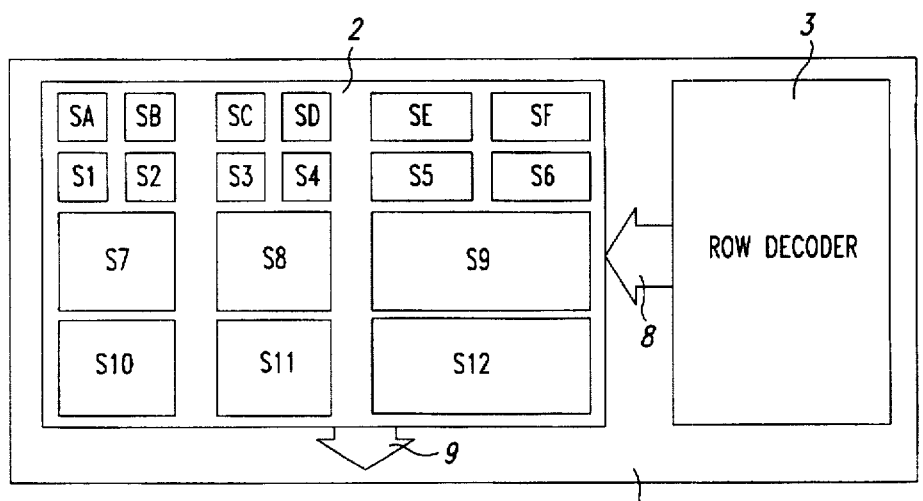
FIG. 8 shows a variation of the memory according to the present invention.

The architecture of the memory according to the present invention provides for increasing the number of sectors to meet different user requirements. Additional data sectors, in fact, may be provided using the same control circuitry and by simply increasing the size of the row decoder, as shown in FIG. 8 which shows only a memory array 2 and row decoder 3. In addition to sectors S1–S12, array 2 also presents further sectors SA, SB, SC, SD, SE, and SF presenting respective local bit lines 14 or 25 and 26 (like sectors S1–S12) and connected to the same global bit lines 13 as sectors S1–S12 by respective selection switches 15 controlled by respective control lines 16.

If the row decoder is formed so as to independently address the rows of sectors SA–SF (for example, by adding a multiplexer 35 and relative circuits to the FIG. 5 embodiment), it is possible, for example, to read sector SA and simultaneously erase sector S4.

The proposed architecture provides for so addressing the memory space as to mask the noncontiguous arrangement of the sectors and so give the customer the impression of working with a contiguous sector arrangement.

For this purpose, a map table need simply be provided upstream from control unit 7, to relate the actual noncontiguous arrangement of the sectors to the apparent contiguous one. This is shown schematically in FIG. 9, which shows only control unit 7 and map table 73 of memory 1. Map table 73 receives the addresses supplied externally and relative to the "ideal" arrangement required by the customer (arrow 7a), and supplies the actual internal addresses corresponding to the real arrangement of the sectors (arrow 75). The actual addresses 75 may also be supplied directly to the row and column decoders.

Figure 9:
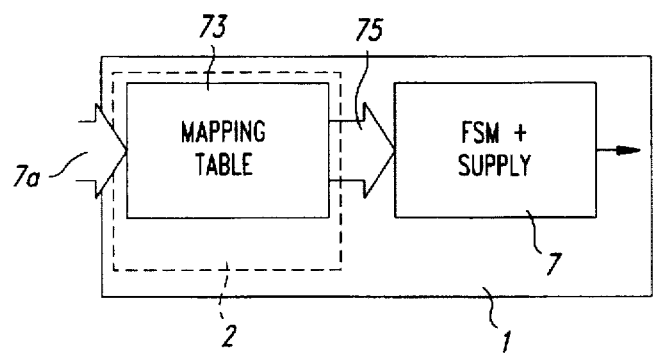
FIG. 9 shows a further variation of the memory according to the present invention.

Map table 73 may be formed in any way, as a logic circuit or a memory element; and, in the latter case, it may be implemented by a special memory array, or using a portion of memory array 2 as shown schematically in FIG. 9.

Figure 9A:
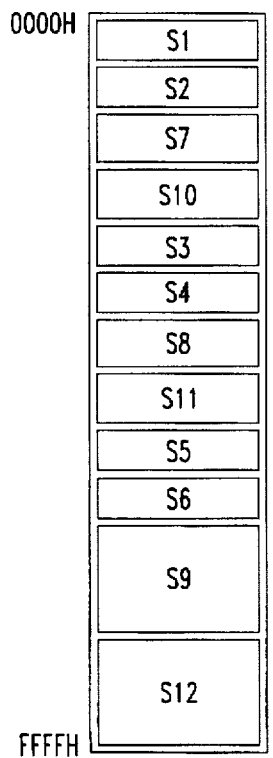
FIGS. 9a and 9b show logic map diagrams relative to a known memory, and relative to the FIG. 9 variation of the memory according to the present invention.
Figure 9B:
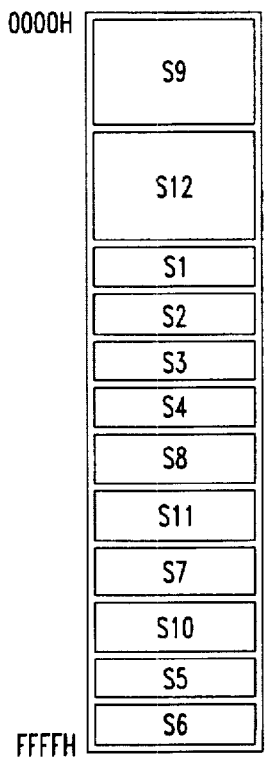

Consequently, as opposed to a linear sector arrangement, as in the known memory map in FIG. 9a, an arrangement is achieved which is better suited to the requirements of the user, as shown in FIG. 9b, and which provides for more conveniently organizing the memory space, for example, by maintaining the program storage sectors adjacent to the data sectors.

Moreover, in the case of a map table 73 in the form of an erasable, reprogrammable memory, it may be programmed freely by the customer, who may alter the relative position of the sectors within the memory space as required.

Figure 10:
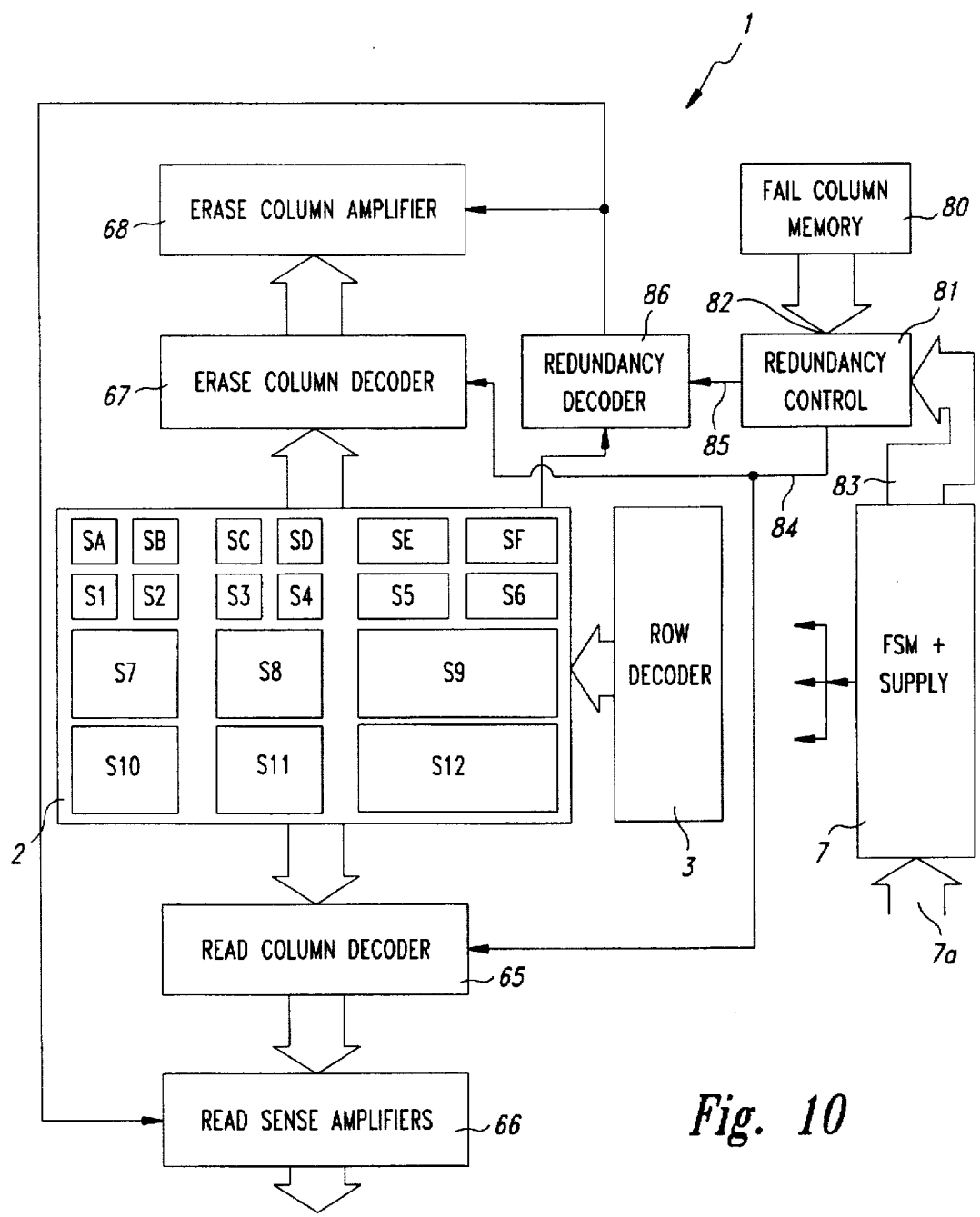
FIG. 10 shows a further variation of the present invention.

The proposed architecture provides for trouble free column redundancy control, and the addition of further sectors, with no additional circuitry, for enabling or reading redundancy column addresses. One solution is shown in FIG. 10 in which, in addition to program and data sectors S1–S12, memory array 2 also comprises sectors SA–SF similar to those in FIG. 8; and sectors S1–S12 and SA–SF comprise redundancy columns connected to respective global bit lines. Memory 1 also comprises a fail column memory 80; and a redundancy control unit 81 which is supplied by control unit 7 (arrow 83) with the addresses of the (read or write) enabled cells, and by fail column memory 80 (arrow 82) with the addresses of the fail columns. Redundancy control unit 81 then compares the incoming addresses, and, in the event they match (fail column addressed), disables, over line 84, the read and erase column decoders 65 and 67, and enables, over line 85, a special redundancy decoder 86 output connected to read and erase sense amplifiers 66 and 68. This operation provides for disabling the fail column via decoders 65 and 67, and for enabling and substituting the corresponding redundancy column via redundancy decoder 86, thus maintaining the structure of memory 1, regardless of whether it is expanded by sectors SA–SF or presents the basic structure composed, for example, of sectors S1–S12.

Alternatively, instead of making the whole column redundant in the event of failure of only a portion of it (local bit line), it is possible to make only the failed local bit line, e.g., of sector S7, redundant, and not those of the sectors SB, S2 and S10 connected to the same global bit line. In this case, however, the greater adaptability of the memory to cope with a larger number of fail conditions demands a more complex control logic.

According to a further variation, redundancy decoder 86 may be dispensed with, and the redundancy control unit made to control column decoders 65 and 67 to address the redundancy global bit lines as opposed to the failed addressed ones.

As compared with known solutions comprising redundancy sectors, the architecture according to the invention presents the advantage of making only the fail columns in a specific sector redundant, instead of a whole column of cells belonging to superimposed sectors, thus reducing the number of rows required in the redundancy sectors and hence the size of the memory as a whole.

The advantages of the memory device according to the invention will be clear from the foregoing description. In particular, the architecture described provides for operating simultaneously in two sectors of the memory array, thus greatly reducing memory access time, especially when erasing a sector; presents a high degree of modularity; and permits remapping of the sectors and hence trouble free use and straightforward redundancy operations.

Clearly, changes may be made to the memory device as described and illustrated herein without, however, departing from the scope of the present invention. In particular, the solutions described may be applied to an isolated, preferably flash, memory device, as well as to memories integrated in microcontrollers and dedicated memories such as ASM (Application Specific Memory) devices; and the global bias lines connected to local bias lines may also be word lines instead of or in addition to bit lines.

We claim:

1. A memory device comprising a number of memory cells grouped into a plurality of sectors,
   each sector having a respective common source line;
   all of the memory cells in a sector coupled to the respective common source line;
   wherein the memory device comprises means for simultaneously addressing at least two said sectors of said memory array.

2. A memory device comprising a memory array including a number of memory cells grouped into a plurality of sectors; characterized in that the memory device comprises means for simultaneously addressing at least two sectors of memory array, wherein said sectors are arranged in rows of sectors and columns of sectors, and form first lines of sectors extending in a first direction, and second lines of sectors extending in a second direction perpendicular to the first direction; characterized in that the device comprises global bias lines extending parallel to said first direction and substantially along the whole length of said first lines of sectors; a plurality of local bias lines for each said global bias line, said local bias lines extending parallel to said first direction and being at least equal in number to the sectors forming said first lines of sectors; a plurality of sector selection means interposed between each local bias line and a respective global bias line; and control means for said selection means for separately controlling said sectors.

3. A device as claimed in claim 2, characterized in that said sector selection means comprise sector selection transistors having a control terminal connected to control lines in turn connected to local decoding units; at least one said control line being provided for each sector.

4. A device as claimed in claim 3, characterized in that said global bias lines are global bit lines; said local bias lines are local bit lines; and said local decoding units are column decoding units controlled by a control unit of the memory device.

5. A device as claimed in claim 4, characterized in that said control lines extend between adjacent rows of sectors.

6. A device as claimed in claim 4, characterized in that it comprises a first and second local bit line for each global bit line and for each sector; and said sector selection transistors comprise first sector selection transistors located between each global bit line and the respective first local bit line, and second sector selection transistors located between each global bit line and the respective second local bit line; said first sector selection transistors in the same sector being connected to the same first control line; and said second sector selection transistors in the same sector being connected to the same second control line.

7. A device as claimed in claim 4, and comprising a row decoding unit formed of a plurality of decoding sections; characterized in that each said decoding section comprises two pluralities of address inputs, and one plurality of address selection inputs; each said plurality of address inputs being connected to a respective plurality of address lines to supply each said decoding section with two different row addresses; and said address selection inputs being connected to respective address selection lines, to supply each decoding section of said decoding unit with information signals relative to which of the two addresses is to be used.

8. A device as claimed in claim 4 wherein a digital word is formed of a plurality of bits, each formed word is memorized in a respective memory cell; characterized in that the memory cells relative to the same digital word all belong to the same sector.

9. A device as claimed in claim 8, and comprising a column decoding unit, of said column decoding units, connected to said global bit lines; characterized in that said column decoding unit comprises a plurality of output lines; each output line being connected to a plurality of global bit lines belonging to different columns of sectors.

10. A device as claimed in claim 9, characterized in that said column decoding unit comprises a plurality of first bit selection transistors along said global bit lines; all said first bit selection transistors relative to global bit lines connected to a same output line (B1–B16) being controlled by a same selection signal.

11. A device as claimed in claim 9, characterized in that at least one column of sectors comprises a number of global bit lines greater than the number of said output lines; and said global bit lines in said at least one column of sectors are grouped into groups of lines; the global bit lines in one group of lines being connected together, and being connected to the respective output line by a second bit selection transistor.

12. A device as claimed in claim 10, characterized in that it comprises third bit selection transistors located along said global bit lines in said groups of lines, and controlled by said selection signal controlling said first selection transistors.

13. A device as claimed in claim 4, characterized in that it comprises a first and second column decoding unit, of said column decoding units, connected to said global bit lines; and a first and second sense amplifying unit respectively connected to said first and second column decoding unit.

14. A device as claimed in claim 13, characterized in that said first column decoding and sense amplifying unit are activated during a reading step; and said second column decoding and sense amplifying unit are activated during an erasing and writing step.

15. A device as claimed in claim 4, characterized in that it comprises a mapping unit presenting a plurality of address inputs supplied with customer sector address signals, and a plurality of address outputs supplying real sector address signals; said mapping unit memorizing the correlation between said customer sector address signals and said real sector address signals.

16. A device as claimed in claim 15, characterized in that said mapping unit comprises a nonvolatile memory.

17. A device as claimed in claim 16, characterized in that said nonvolatile memory is formed by a portion of said memory array.

18. A memory device comprising:
an array of memory cells having a plurality of sectors;
the memory cells in each sector coupled to a respective common source line to allow simultaneous erasure of the cells of the sector independently of the cells in other sectors; and
a decoder circuit operable for simultaneously addressing at least two said sectors of the memory array.

19. A memory device comprising:
an array of memory cells having a plurality of sectors;
a decoder circuit operable for simultaneously addressing at least two said sectors of the memory array;
a plurality of global bit lines defining columns of said sectors;
a plurality of local bit lines for each global bit line, said plurality of local bit lines extend parallel to said columns of sectors and being equal in number to the sectors forming said columns of sectors; and
a plurality of sector selection switches interposed between each local bit line and a respective global bit line, wherein each said switch having a control means for separately controlling said sectors.

20. The memory device of claim 19 wherein the sector selection switches further include:
sector selection transistors having a control terminal;
control lines connected to said control terminal, at least one said control line being provided for each sector; and
column decoding units connected to said transistors and controlled by a control unit of the memory device.

21. The memory device of claim 20, further includes:
a first and second local bit line, of said plurality of bit lines, for each global bit line and sector;
first sector selection transistors, of said sector selection transistors, positioned between each global bit line and the respective first local bit line, in the same sector and connected to the same first control line; and
second sector selection transistors, of said sector selection transistors, positioned between each global bit line and the respective second local bit line, in the same sector being connected to the same second control line.

22. The memory device of claim 20 wherein said decoder circuit further includes:
a plurality of common word lines defining rows of said sectors;
a row decoding unit connected to said plurality of common word lines and having a plurality of decoding sections;
a first and second plurality of address inputs, each said address inputs being connected to a respective plurality of address lines to supply each said decoding section with two different row addresses; and
a first plurality of address selection inputs, said selection inputs being connected to respective address selection lines to supply each section of said row decoding unit with information signals relative to which of the two addresses is to be used.

23. The memory device of claim 22 wherein said row decoding unit further includes:
a multiplexer having input and output terminals, said multiplexer input terminal receiving said first and second plurality of address inputs and said first plurality of address selection inputs;
a logic unit having inputs from said multiplexer and outputs connected to said plurality of common word lines;
an enabling unit connected to a control line; and
a first and second supply selection transistor having control terminals connected to outputs of said enabling unit, said first and second transistor controlling said logic unit outputs.

24. The memory device of claim 20, further includes:
a digital word having a plurality of bits, said bits being stored in a respective memory cell, wherein the memory cells relative to the same digital word all belong to the same sector.

25. The memory device of claim 20 wherein said column decoding units further includes:

a plurality of output lines coupled to the said column decoding unit and coupled to one of said global bit lines, each said output line being connected to its respective global bit line through one of the sector selection switches.

26. The memory device of claim 19 wherein said decoder circuit further includes:

a first and second column decoding unit connected to said global bit lines; and a first and second sense amplifying unit respectively connected to said first and second column decoding unit.

27. The memory device of claim 26 wherein said first column decoding and sense amplifying units are activated during a reading step, and said second column decoding and sense amplifying units are activated during an erasing and writing step.

* * * * *